(12) United States Patent
Dick

(10) Patent No.: US 6,307,418 B1
(45) Date of Patent: Oct. 23, 2001

(54) RECTIFIER CIRCUIT

(75) Inventor: Burkhard Dick, Hamburg (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/700,396
(22) PCT Filed: Mar. 10, 2000
(86) PCT No.: PCT/EP00/02186
 § 371 Date: Nov. 13, 2000
 § 102(e) Date: Nov. 13, 2000
(87) PCT Pub. No.: WO00/54400
 PCT Pub. Date: Sep. 14, 2000

(30) Foreign Application Priority Data

Mar. 11, 1999 (DE) .............................. 199 10 800
Jul. 7, 1999 (DE) .............................. 199 31 295

(51) Int. Cl.[7] .............................. H03K 17/60; H03K 3/00
(52) U.S. Cl. .............................. 327/303; 327/66; 327/490
(58) Field of Search .................... 327/303, 354, 327/104, 63, 65, 66, 67, 69, 70, 71, 77, 89, 478, 489, 490

(56) References Cited

U.S. PATENT DOCUMENTS 4,339,674 * 7/1982 Hashimoto .............................. 327/77
5,721,507 * 2/1998 Fujii et al. .............................. 327/303

* cited by examiner

*Primary Examiner*—Toan Tran
(74) *Attorney, Agent, or Firm*—Steven R. Biren

(57) ABSTRACT

A rectifier circuit is described, which comprises an arrangement of a first, a second and a third transistor, emitters of said transistors being coupled together at a first junction point and to a terminal of a first constant current source and in which arrangement collectors of the first and the second transistor are coupled together at a second junction point, a current mirror arrangement having a predetermined mirror ratio, an input of said current mirror being coupled to the second junction point and an output of said current mirror being coupled to a collector of the third transistor at a third junction point, wherein an input voltage, by which the collector-emitter currents of the first and/or the second transistor are controllable, can be supplied to the rectifier circuit bia bases of the first and/or the second transistor, while an output voltage can be taken from the base of the third transistor of the rectifier circuit and the output voltage at least substantially corresponds to the rectified input voltage, and the first, the second and the third transistor have predetermined emitter regions. To provide a rectifier circuit of a simple structure, ensuring an at least substantially linear signal processing also in the range of its working point, the rectifier circuit according to the invention comprises a complementary current stage, which is controllable by the output voltage and supplies at least a complementary current to the input and/or output of the current mirror arrangement, said complementary current corresponding for all values of the output voltage at least substantially to the lower value of the collector-emitter currents of the first and the second transistor.

10 Claims, 4 Drawing Sheets

RECTIFIER CIRCUIT

BACKGROUND OF THE INVENTION

The invention relates to a rectifier circuit, comprising an arrangement of a first, a second and a third transistor emitters of said transistors being coupled together at a first junction point and to a terminal of a first constant current source and in which arrangement collectors of the first and the second transistor are coupled together at a second junction point, a current mirror arrangement having a predetermined mirror ratio, an input of said current mirror being coupled to the second junction point and an output of said current mirror being coupled to a collector of the third transistor at a third junction point, wherein an input voltage, by which the collector-emitter currents of the first and/or the second transistor are controllable, can be supplied to the rectifier circuit via bases of the first and/or the second transistor, while an output voltage can be taken from the base of the third transistor of the rectifier circuit and the output voltage at least substantially corresponds to the rectified input voltage, and the first, the second and the third transistor have predetermined emitter regions.

In many transmission systems, rectifiers are used, for example, in AM demodulators or level detectors. They are mainly used for measuring signal amplitudes. Precision rectifiers, as are preferably used for AM demodulators, are characterized by a linear characteristic also for small input voltages and, in contrast to, for example, a simple semiconductor diode, thus approximate the characteristic form of an ideal rectifier. Achieving such a characteristic is very difficult and elaborate.

FIG. 1 shows diagrammatically a simple rectifier circuit which can be integrated on a semiconductor body. It comprises an arrangement of a first transistor 1, a second transistor 2 and a third transistor 3, all of which are of the bipolar NPN type and whose emitters are interconnected at a first junction point 9. Furthermore, a first constant current source 12 is connected by one of its terminals to the first junction point 9, while the second terminal of the first constant current source 12 is connected to ground 15. The collectors of the first and the second transistor 1, 2 are further interconnected at a second junction point 10. Moreover, the second junction point 10 is connected to an input of a current mirror arrangement comprising a fifth transistor 5 and a sixth transistor 6. The fifth and the sixth transistor are bipolar transistors of the PNP type. Their emitters are connected to a power supply terminal 16. The bases of the fifth and the sixth transistor are interconnected and are connected to the second junction point 10. Moreover, a collector of the fifth transistor 5 is connected as an input of the current mirror arrangement to this second junction point 10. A collector of the sixth transistor 6 is connected at a third junction point 11 to a collector of the third transistor 3 and constitutes an output of the current mirror arrangement.

The rectifier circuit shown in FIG. 1 further comprises a fourth transistor 4 which is of the bipolar NPN type. The fourth transistor 4 constitutes an output amplifier element of the rectifier circuit shown in FIG. 1. To this end, a collector of the fourth transistor 4 is connected to the power supply terminal 16. A base of the fourth transistor 4 is connected to the third junction point 11. An emitter of the fourth transistor 4 is connected by means of a base of the third transistor 3 and a terminal of a third constant current source 14 to an output terminal 17 of the rectifier circuit. By means of a further terminal, the third constant current source 14 is connected to ground 15.

In the rectifier circuit shown in FIG. 1, bases of the first and the second transistor 1, 2 serve as input terminals of the rectifier circuit. During operation of the rectifier circuit, an input voltage UE is applied between these bases, which input voltage generally comprises a DC component and an AC component in accordance with which the input voltage UE is controlled by said DC component. For the sake of simplicity, the input voltage UE will hereinafter be understood to mean only the AC component. This AC component UE controls the bases of the first and the second transistor 1 symmetrically with respect to said DC component. Due to the control of the described rectifier circuit with the input voltage UE, an output voltage, whose AC component is denoted by UA, is generated at the output terminal 17.

The rectifier circuit shown in FIG. 1 operates as a voltage follower. This results in the following division for the collector-emitter currents I1, I2, I3, I5, I6 in the first, the second, the third, the fifth and the sixth transistor 1, 2, 3, 5, 6, assuming that all of these transistors have the same emitter regions and that the mirror ratio of the current mirror arrangement 5, 6 to 1 is thus chosen. Without an AC component UE of the input voltage, i.e. without control of the input of the rectifier circuit, the same currents, i.e. I1 is equal to I2, flow in the collector-emitter paths of the first and the second transistor 1, 2. The sum of both currents, I1+I2, is equal to the input current I5 of the current mirror arrangement 5, 6, i.e. equal to the collector-emitter current of the fifth transistor 5. This in turn corresponds to the current I6 and, while ignoring the base current of the fourth transistor 4, the current I6 corresponds to the collector-emitter current I3 of the third transistor 3. Its value for UE=0, i.e. the working point current in the third transistor 3, is denoted by I0. For UE=0, I5 and I6 are therefore I0, while the collector-emitter currents I1 and I2 of the first and the second transistor 1, 2 assume the value I0/2, and the constant current I012 supplied by the first constant current source 12 corresponds to the double value of the working point current I0 of the third transistor 3.

Since the current density in the first and the second transistor 1, 2 is thus half as large as the current density in the third transistor 3, the first and the second transistor 1, 2 for UE=0, i.e. at the working point of the rectifier circuit, have a base-emitter voltage which is lower than the base-emitter voltage of the third transistor 3 at the working point. A voltage shift thereby results for the output voltage UA at the output terminal of the rectifier circuit, which voltage shift corresponds to the temperature voltage of the bipolar transistors 1, 2, 3 used in the rectifier circuit shown, multiplied by the natural logarithm of the number 2. At room temperature, this is a value of 18 mV for bipolar silicon transistors.

When, starting from the working point at UE=0, the value for the input voltage UE is increased, the input voltage UE assumes positive values and the second transistor 2 becomes more conducting than the first transistor 1. The second transistor thus takes over more and more collector-emitter current from the first transistor. Consequently, the current density in the second transistor approaches that in the first transistor because the value of the current I2 approaches the value of the current I5 and thus the value of the current I3 in the process described. Consequently, the difference between the base-emitter voltages of the second and the third transistor 2, 3 is reduced, and the voltage shift between the input voltage UE and the output voltage UA of the rectifier circuit shown in FIG. 1 is reduced. In a border case, the current I1=0 and UE=UA. The output voltage UA then exactly follows the input voltage UE.

If, in contrast, the value of the input voltage UE is reduced, i.e. when UE assumes negative values, starting from the working point, the first transistor 1 more and more takes over the collector-emitter current of the second transistor 2. Then, the value of the current I1 approaches the current I3 more and more and the voltage shift between the input voltage UE and the output voltage UA is also reduced. In both border cases, in which the amount of the value of the input voltage UE is large with respect to 0, the currents I3, I5, I6 as well as the currents I1 and I2 still only flowing in the first and the second transistor 1, 2, respectively, assume the value I0.

FIG. 2 shows the characteristic described above between the input voltage UE and the output voltage UA of the rectifier circuit of FIG. 1 as a solid-line characteristic curve. The non-linear rounding of this characteristic curve in the range of the working point is shown diagrammatically. Due to this non-linear distortion, the rectifier circuit of FIG. 1 is no longer usable for precision rectifiers which, on the one hand, must comply with very stringent requirements imposed on the linearity of signal transmission and, on the other hand, must also transmit signals of small voltage amplitudes with a very small distortion.

SUMMARY OF THE INVENTION

It is an object of the invention to provide a rectifier circuit which has a simple structure and ensures an at least substantially linear signal processing, also in the range of its working point.

According to the invention, in a rectifier circuit of the type described, this object is achieved by a complementary current stage, which is controllable by the output voltage and supplies at least a complementary current to the input and/or output of the current mirror arrangement, said complementary current corresponding for all values of the output voltage at least substantially to the lower value of the collector-emitter currents of the first and the second transistor.

The invention is based on the recognition that the output voltage of a rectifier circuit of the type described follows the input voltage without errors, i.e. without voltage deviations, when the base-emitter voltages of the transistors for the implementation of the characteristic curve at least substantially correspond in the overall control range of the input voltage and that such a correspondence is achieved when the current densities in these transistors correspond for all values of the input voltage. This means that, in the rectifier circuit shown in FIG. 1, the current density in the third transistor 3 at least substantially corresponds to the current density in the second transistor 2 or to that in the first transistor 1, dependent on a control with positive or negative values for the input voltage UE. In the rectifier circuit shown in FIG. 1, this correspondence is, however, disturbed by the other, smaller current I1, I2 in the first and the second transistor 1, 2, respectively. It could be realized when the influence of this current via the current mirror arrangement 5, 6 on the current I3 in the third transistor can be prevented. According to the invention, this is effected by the complementary current stage. The complementary current supplied by this stage is either applied to the input or to the output of the current mirror arrangement in such a way that the influence of the smaller one of the two currents I1, I2 is neutralized. According to the invention, this complementary current stage is controlled in a very simple way by the output voltage of the rectifier circuit according to the invention, because particularly its deviation from the value resulting in accordance with an ideal rectifier characteristic curve is a direct measure for the deviation of the current densities to be compensated and thus represents the smaller one of the two currents I1 and I2 to be compensated in the first and the second transistor, respectively.

In accordance with a further advantageous embodiment of the rectifier circuit according to the invention, the complementary current is taken from the output of the current mirror arrangement via the third junction point. In this case, the complementary current is copied from that current component in the current supplied by the current mirror arrangement which is redundant for feeding the third transistor. If, in contrast, a current is supplied through the current mirror arrangement in the case of a different dimensioning of the rectifier circuit according to the invention and in a given case of operation, which current is smaller than the current required in the third transistor, a corresponding complementary current can also be supplied to the third transistor. In further modifications of the rectifier circuit according to the invention, the complementary current may further be applied to the input of the current mirror arrangement via the second junction point. This may be chosen for a dimensioning of the rectifier circuit for which, in given cases of operation, the current supplied through the current mirror arrangement is smaller than the current in the third transistor required to obtain an at least substantially ideal rectifier characteristic curve. In corresponding other cases of dimensioning, the complementary current may finally also serve for reducing the current at the input of the current mirror arrangement so as to achieve a smaller current in the third transistor. In another embodiment of the rectifier circuit according to the invention, the complementary current stage comprises a differential amplifier arrangement having an input which receives the output voltage of the rectifier circuit, and an output supplying the complementary current. This very simple circuit arrangement allows a very precise control of the complementary current and hence a satisfactory linearization of the rectifier characteristic curve. The differential amplifier arrangement of the complementary current stage preferably comprises an emitter-coupled transistor pair with a second constant current source feeding this pair. Such a construction of the complementary current stage is not only very simple but also complies with strict requirements as regards operation at a low supply voltage and a low power input. Such a circuit is thereby universally usable.

In the rectifier circuit according to the invention, the first, the second and the third transistor as well as the transistors of the emitter-coupled transistor pair of the differential amplifier arrangement of the complementary current stage preferably have at least substantially equal emitter regions. This results not only in a very simple construction and manufacture of the rectifier circuit according to the invention, but also in a very simple and accurate adaptation of the operating parameters of the components in operation. Particularly the first, the second and the third transistor as well as the transistors of the emitter-coupled transistor pair of the differential amplifier arrangement of the complementary current stage convey at least substantially the same working point current in the case of said dimensioning. In this case, a very significant, advantageous embodiment consists in that the values of the current supplied by the first constant current source, the current supplied by the second constant current source and the working point current are in the ratio of 3:2:1. The collector-emitter currents of the relevant transistors at the working point of the rectifier circuit, i.e. for UE=0, are designated as the working point currents.

For a further improvement of the signal behavior of the rectifier circuit, it may comprise an amplifier stage whose input receives the output voltage of the rectifier circuit and whose output controls the complementary current stage. It is achieved by this amplifier stage that the AC component in the output voltage has the same amplitude as the AC component of the input voltage.

When the complementary current stage comprises a differential amplifier arrangement, the input of this differential amplifier arrangement is preferably coupled to the output of the amplifier stage. The output of the differential amplifier arrangement comprised in the complementary current stage supplies the complementary current.

The amplifier stage preferably has an AC voltage gain of at least substantially a value of 2 between the output voltage of the rectifier circuit and the complementary current stage.

In this embodiment, also the voltage at the input is optionally used with respect to the voltage at the output of the amplifier stage as an output voltage of the rectifier circuit. For the output voltage of the rectifier circuit, said gain of the amplitude of the AC component is not present, but in any case the complementary current stage is controlled with the larger AC component so that said improvement of the signal behavior of the rectifier circuit ensues.

BRIEF DESCRIPTION OF THE DRAWINGS

In the drawings, in which corresponding elements in the Figures have the same reference numerals.

DESCRIPTION OF THE PREFERRED EMBODIMENTS

Figure 1:
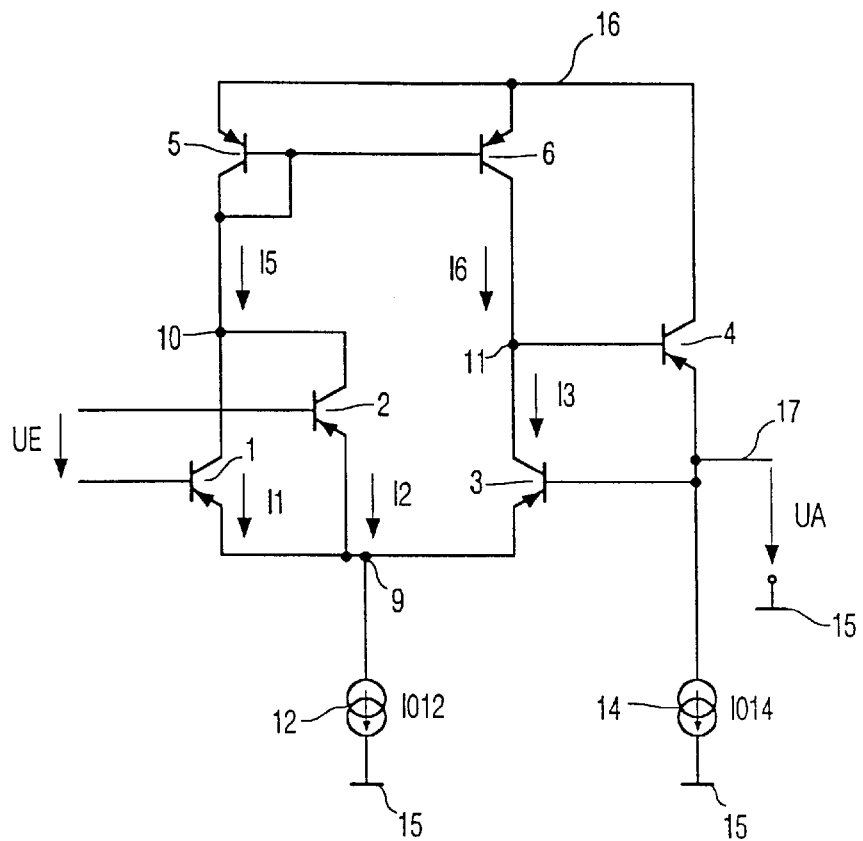
FIG. 1 shows a rectifier circuit of the type described above.
Figure 3:
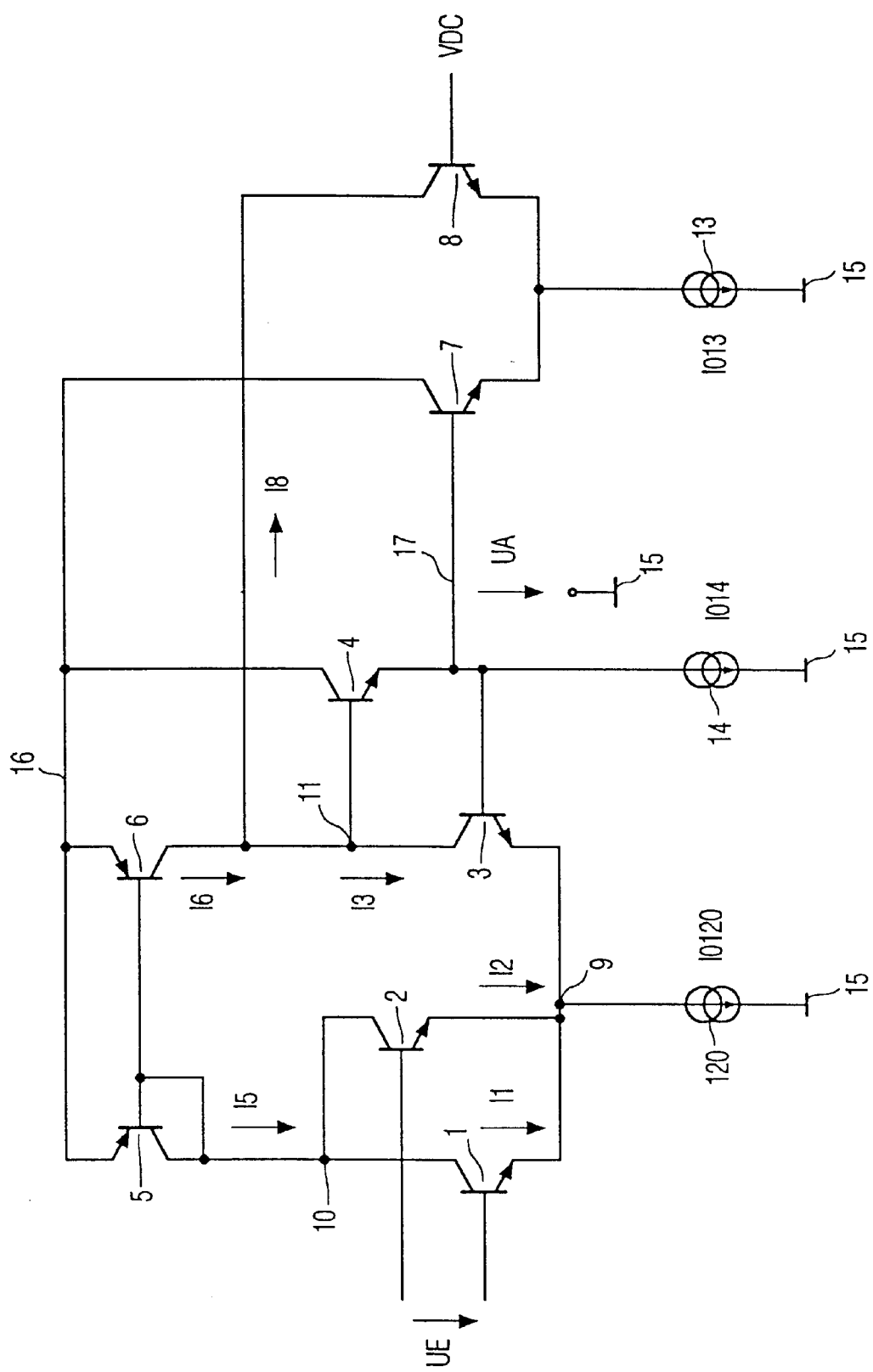
FIG. 3 shows a first embodiment of the rectifier circuit according to the invention.

The embodiment shown in FIG. 3 essentially comprises again the rectifier circuit shown in FIG. 1, in which, as in this Figure, a first, a second, a third, a fourth, a fifth and a sixth transistor 1 to 6 are arranged. A variant of the first constant current source denoted by the reference numeral 120 is inserted between the first junction point 9, at which the emitters of the first, the second and the third transistor 1, 2, 3 are interconnected, and ground 15, which constant current source conveys a constant current I0120 which corresponds to three times the working point current through the third transistor 3, i.e. the current I0120 is equal to three times the current I0. In contrast, the third constant current source 14 is unchanged and conveys a constant current I014 also in the embodiment shown in FIG. 3 as well as in the rectifier circuit shown in FIG. 1. The input voltage UE is again applied between the bases of the first and the second transistor 1, 2 and the output voltage UA is taken from the output terminal 17 connected to the base of the third transistor 3.

The circuit arrangement shown in FIG. 3 further comprises a complementary current stage which, in the embodiment shown, comprises a differential amplifier arrangement which consists of an emitter-coupled transistor pair comprising a seventh transistor 7 and an eighth transistor 8 with a second constant current source 13 feeding this transistor pair. The second constant current source 13 conveys a constant current I013 which corresponds to the double value of the working point current I0 of the third transistor 3 at the working point UE=0. The seventh and the eighth transistor 7, 8 are of the bipolar NPN type. The terminal of the second constant current source 13 remote from the emitters of the seventh and the eighth transistor 7, 8 is connected to ground 15. A DC voltage VDC is applied to the base of the eighth transistor 8, which DC voltage corresponds to the DC component, i.e. the working point potential of the voltage applied to the bases of the first and the second transistor 1, 2. The voltage VDC is thus the working point potential of the AC component of the input voltage, i.e. the working point potential of the input voltage UE. For a precise function of the rectifier circuit shown in FIG. 3, it is significant that this DC component VDC at the base of the eighth transistor 8 is also adjusted at least substantially exactly. The collector-emitter current I8 in the eighth transistor 8 is the complementary current in the embodiment shown in FIG. 3. To supply this complementary current I8 in the desired manner at the output of the current mirror arrangement 5, 6, the collector of the eighth transistor 8 is connected to the third junction point 11. The collector of the seventh transistor 7 is connected to the power supply terminal 16.

In the embodiment of FIG. 3, the first, the second, the third, the seventh and the eighth transistor 1, 2, 3, 7, 8 have identical emitter regions. A ratio of 3:2:1 is adjusted between the constant current I0120 of the first constant current source 120 in FIG. 3, the constant current I013 of the second constant current source 13 and the working point current I0 in the third transistor 3 for the case where UE=0. At the working point, i.e. for UE=0, the currents I1, I2 and I3 correspondingly assume the value I0. The currents I5 and I6 in the current mirror arrangement 5, 6 correspondingly amount to the double value of current I0. The complementary current has the value I0 at the working point. At the working point of the rectifier circuit of FIG. 3, a complementary current I8 of the value I0 is taken from the output of the current mirror arrangement 5, 6 at the collector of the sixth transistor 6 and drained via the eighth transistor 8 in the complementary current stage. Without the complementary current I8, the value of the current I3 at the working point would correspond to the double value of the current I0. However, since the base-emitter voltages of the first, the second, the third, the seventh and the eighth transistor 1, 2, 3, 7, 8 now correspond to each other, the output voltage UA also exactly assumes the value of the input voltage UE. At the working point there will thus be no voltage shift between the input voltage UE and the output voltage UA, as is the case in the rectifier circuit shown in FIG. 1.

When, starting from the working point UE=0, the value of the input voltage UE is increased by a positive input voltage UE in the sense of a control, the current I2 increases, whereas the current I1 decreases more than proportionally. Consequently, the current at the input decreases and hence also at the output of the current mirror arrangement 5, 6, i.e. the currents I5 and I6 decrease. In contrast, however, the current I3 through the third transistor 3 increases. Consequently, the base-emitter voltage at the third transistor 3 also increases and causes the output voltage UA to increase to the same extent. Due to the increase of the output voltage UA, the constant current I013 of the second constant current source 13 is conveyed to a greater extent through the collector-emitter path of the seventh transistor 7. However, the complementary current I8 then decreases, as corresponds to the required difference between the currents I6 and I3 in the development of the currents described hereinbefore. In this process, the currents I2 and I3 increase at least substantially uniformly so that the current densities in the second and the third transistor 2, 3 correspond at least substantially for all (positive) values of the input voltage UE. This results in the broken line characteristic curve shown in FIG. 2 for low-value controls, having a very uniform linear variation.

Figure 2:
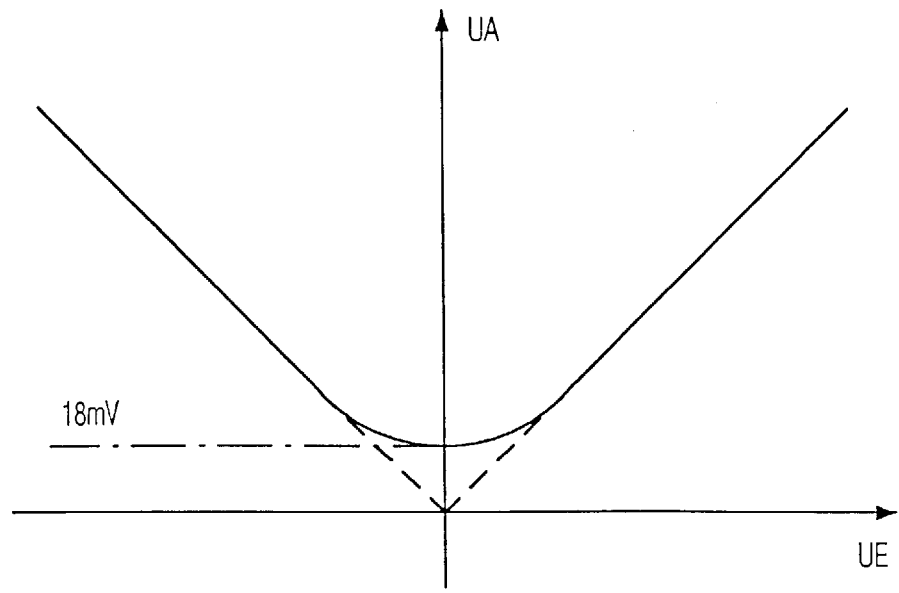
FIG. 2 shows rectifier characteristic curves.

For a control of the rectifier circuit shown in FIG. 3, in which the value of the input voltage UE decreases as from the working point, i.e. for negative values of the input voltage UE the current I1 increases and the current I2 decreases more than proportionally thereto. As against the case with positive values for the input voltage UE, this requires a symmetrically exchanged current distribution in the first and the second transistor 1, 2. The currents in the rest of the circuit arrangement behave in the same way as with a positive control. The described linear characteristic curve of the rectifier circuit in FIG. 3 is thus symmetrical with respect to the working point, as is indicated in FIG. 2.

Figure 4:
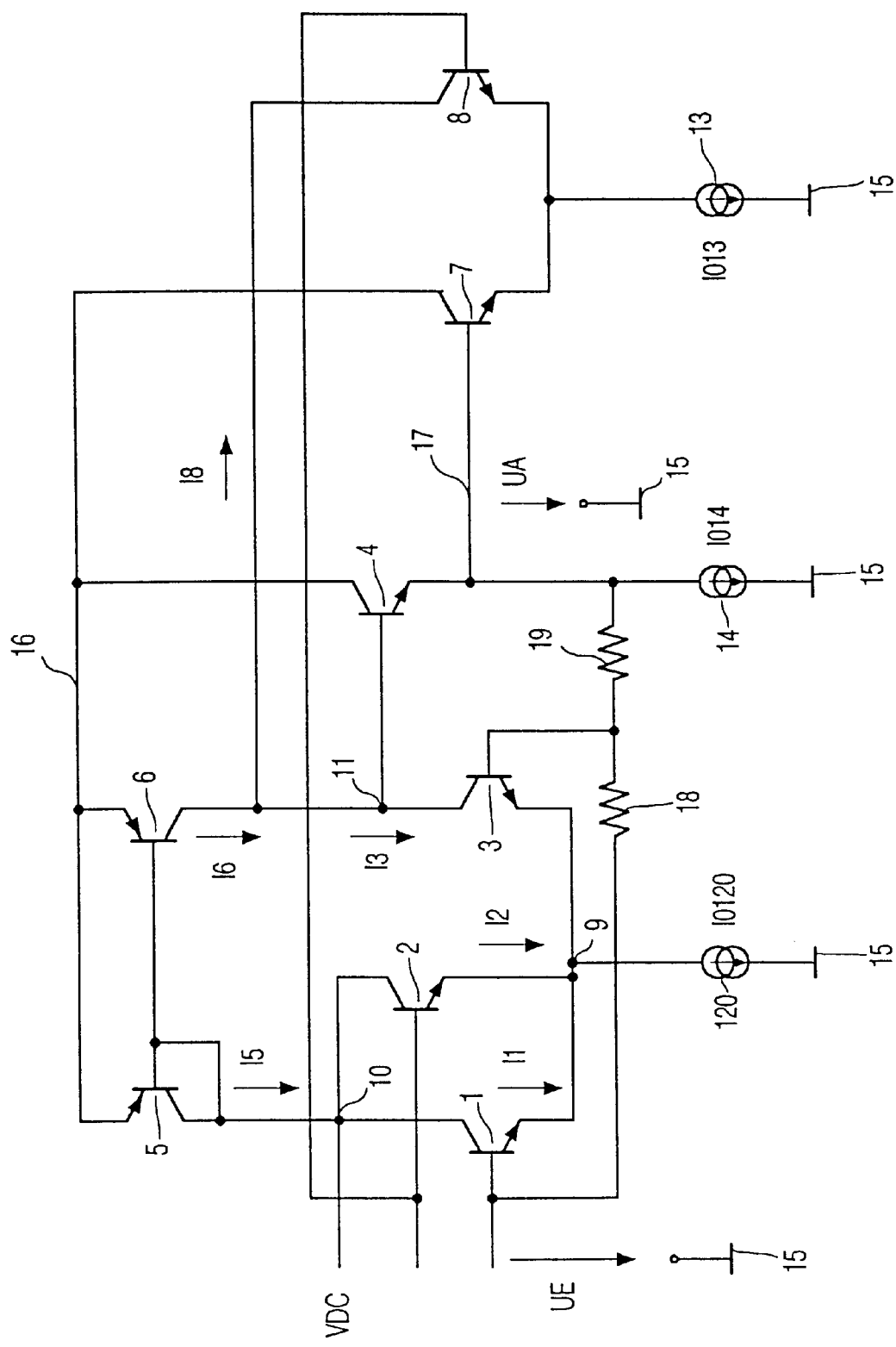
FIG. 4 shows a second embodiment of the rectifier circuit according to the invention.

FIG. 4 shows a modification of the embodiment of FIG. 3, adapted for a one-pole input voltage UE present at ground 15. In addition to FIG. 3, the base of the eighth transistor 8 is connected to the base of the second transistor 2 in FIG. 4; both bases receive the DC component VDC, i.e. the working point potential. The input voltage UE, superimposed as an AC component on its working point potential VDC, is present between the base of the first transistor 1 and ground 15. There is a connection from the base of the first transistor 1 via a first feedback resistor 18 to the base of the third transistor 3. Moreover, the base of the third transistor 3 is connected to the output terminal 17 of the rectifier circuit via a second feedback resistor 19.

The same current and voltage distribution as in FIG. 3 results in FIG. 4 at the working point, when the AC component UE of the input voltage disappears. When a positive input voltage UE is applied, the rectifier circuit shown in FIG. 4 operates as a voltage follower and, as regards its mode of functioning, substantially corresponds to FIG. 3. In this case, no current flows through the feedback resistors 18, 19, and the first and the third transistor 1, 3 constitute a non-inverting differential amplifier. The rectifier circuit of the second embodiment shown in FIG. 4 corresponds to the first embodiment shown in FIG. 3 as far as its mode of functioning is concerned for this (positive) control.

For negative controls, i.e. for negative values of the AC component UE of the input voltage, the arrangement comprising the first, the second and the third transistor 1, 2, 3 and the circuitry constituted by the feedback resistors 18, 19 operates as an inverting differential amplifier. The relations between the currents described for the embodiment shown in FIG. 3 fundamentally also hold for the second embodiment shown in FIG. 4. Accordingly, in the case of negative control, currents I2 and I3 flow in the second and the third transistor 2, 3, which currents also again at least substantially correspond to each other. Consequently, the base of the third transistor 3 remains at least substantially at the working point potential VDC also when the input voltage UE decreases, whereas the potential at the base of the first transistor 1 decreases. As a result, a current flows in the first feedback resistor 18, which current essentially also flows through the second feedback resistor 19 due to the very small base current at the third transistor 3, and produces a voltage at the second feedback resistor 19 by which the output voltage UA is increased with respect to the working point potential. In the case of equally large feedback resistors 18, 19 this increase is effected by the same amount by which the input voltage UE decreases. The complementary current 18 is then again controlled in a manner corresponding to that in FIG. 3.

For the embodiment of FIG. 4, the at least substantially ideal rectifier characteristic curve shown in a broken line in FIG. 2 is then also obtained.

Figure 5:
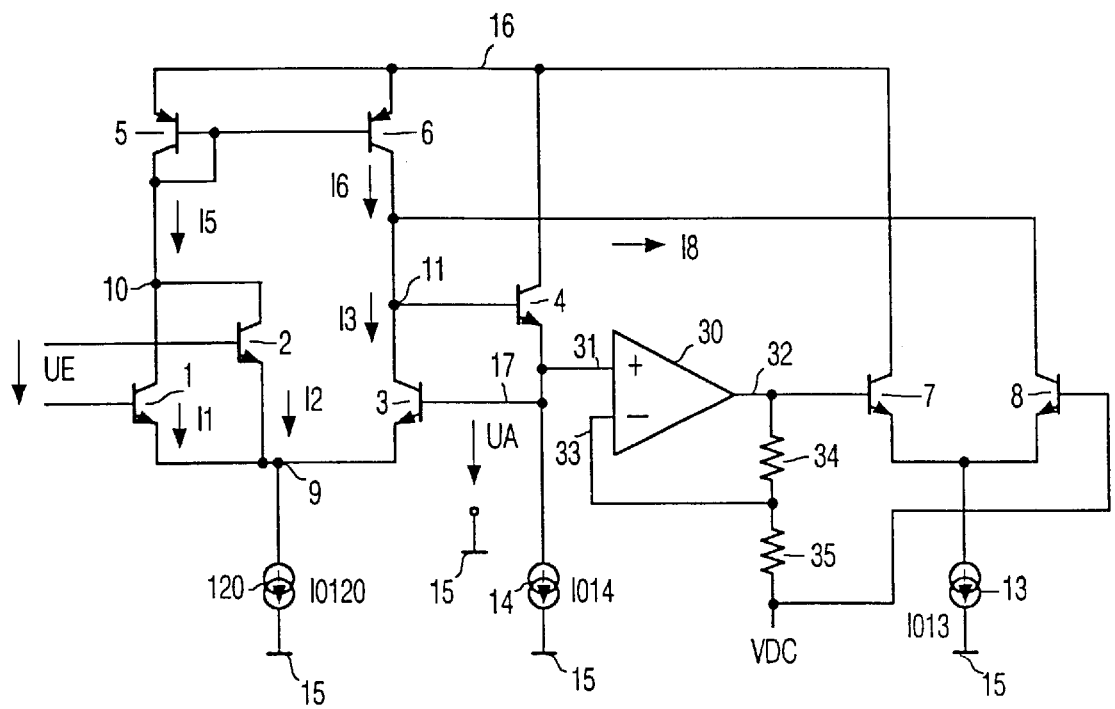
FIG. 5 shows a first modification of the first embodiment of the rectifier circuit according to the invention.

FIG. 5 shows a first modification of the first embodiment of FIG. 3, in which an operational amplifier 30 is inserted in the signal path between the output terminal 17 and the base of the seventh transistor 7, which operational amplifier constitutes a non-inverting amplifier stage with an AC voltage gain of 2. To this end, a non-inverting input 31 of the operational amplifier 30 is connected to the output terminal 17. An output 32 of the operational amplifier 30 is connected to the base of the seventh transistor 7, and an inverting input 33 of the operational amplifier 30 is connected to the output 32 via a third feedback resistor 34. Moreover, there is a connection between the inverting input 33 via a fourth feedback resistor 35 to the base of the eighth transistor 8 to which the working point potential VDC is applied. The third and the fourth feedback resistor 34, 35 have corresponding resistances.

The AC voltage gain of the operational amplifier 30 in the arrangement shown in FIG. 5 has the value of 2. The AC component of the output voltage UA is thereby applied in a factor 2-amplified form to the base of the seventh transistor 7. The DC components remain at least essentially unchanged, i.e. during operation, the working point potential VDC is also present at the output 32 of the operational amplifier 30; the voltages at the feedback resistors 34, 35 disappear.

Figure 6:
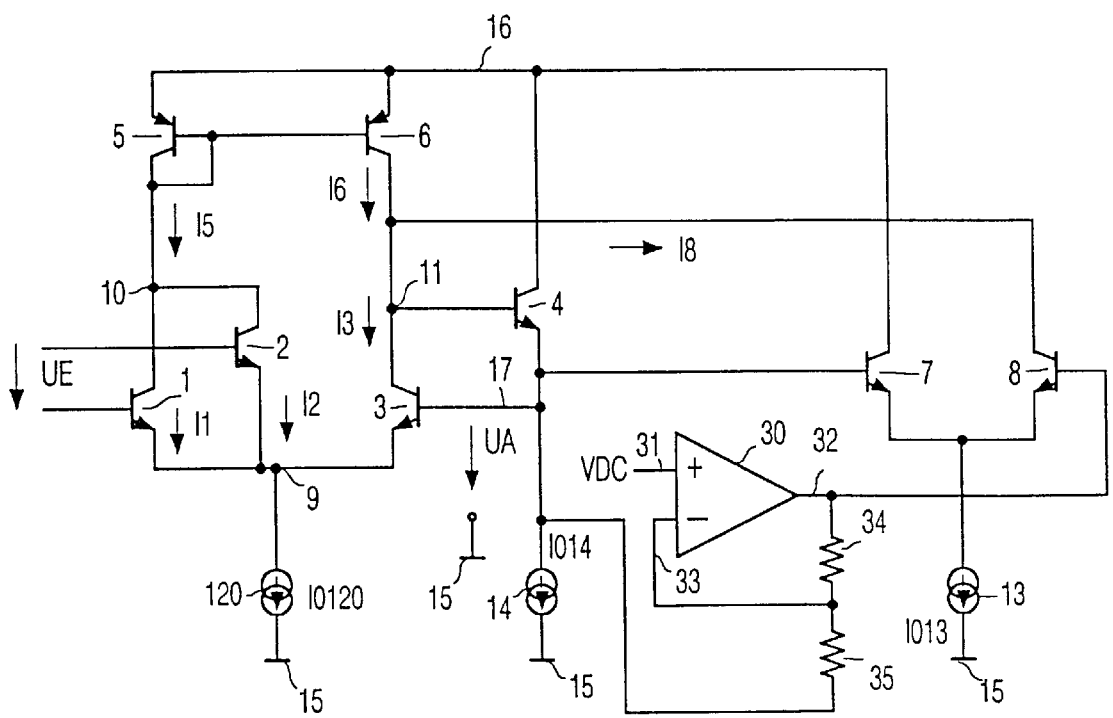
FIG. 6 shows a second modification of the first embodiment of the rectifier circuit according to the invention.

In the second variant of the embodiment of FIG. 3, shown in FIG. 6, the output 32 of the operational amplifier 30 is connected to the base of the eighth transistor 8. The working point potential VDC is applied as a reference voltage to the non-inverting input 31. The inverting input 33 is connected to the output 32 again via the third feedback resistor 34. Moreover, there is a connection between the inverting input 33 via the fourth feedback resistor 35 to the output terminal 17 of the rectifier circuit. The connection between this output terminal 17 and the base of the seventh transistor 7 is unchanged as compared with the embodiment of FIG. 3.

In this configuration, the operational amplifier 30 serves as an inverting operational amplifier with an AC voltage gain of –1 between the output terminal 17 and the base of the eighth transistor 8. The eighth transistor 8 is thereby oppositely controlled with respect to the seventh transistor 7. As a result, an AC voltage gain of 2 is again obtained for the amplifier stage constituted by the operational amplifier 30 with circuitry. At the working point, the differential amplifier constituted by the transistors 7 and 8 is balanced, i.e. the working point potential VDC is present at the bases of both transistors.

What is claimed is:
1. A rectifier circuit comprising
   an arrangement of a first, a second and a third transistor, emitters of said transistors being coupled together at a first junction point and to a terminal of a first constant current source and in which arragement collectors of the first and the second transistor are coupled together at a second junction point,
   a current mirror arrangement having a predetermined mirror ratio, an input of said current mirror being coupled to the second junction point and an output of said current mirror being coupled to a collector of the third transistor at a third junction point, wherein an input voltage, by which the collector-emitter currents of the first and/or the second transistor are controllable, can be supplied to the rectifier circuit via bases of the first and/or the second transistor, while an output voltage can be taken from the base of the third transistor of the rectifier circuit and the output voltage at least substantially corresponds to the rectified input voltage, and the first, the second and the third transistor have predetermined emitter regions, characterized by a complementary current stage, which is controllable by the output voltage and supplies at least a complementary current to the input and/or output of the current mirror arrangement, said complementary current corresponding for all values of the output voltage at least substantially to the lower value of the collector-emitter currents of the first and the second transistor.

2. A rectifier circuit as claimed in claim 1, characterized in that the complementary current is taken from the output of the current mirror arrangement via the third junction point.

3. A rectifier circuit as claimed in claim 1, characterized in that the complementary current is applied to the input of the current mirror arrangement via the second junction point.

4. A rectifier circuit as claimed in claim 1, characterized in that the complementary current stage comprises a differential amplifier arrangement having an input which receives the output voltage of the rectifier circuit, and an output supplying the complementary current.

5. A rectifier circuit as claimed in claim 4, characterized in that the differential amplifier arrangement of the complementary current stage comprises an emitter-coupled transistor pair with a second constant current source feeding said pair.

6. A rectifier circuit as claimed in claim 1, characterized in that the first, the second and the third transistor as well as the transistors of the emitter-coupled transistor pair of the differential amplifier arrangement of the complementary current stage have at least substantially equal emitter regions.

7. A rectifier circuit as claimed in claim 6, characterized in that the first, the second and the third transistor as well as the transistors of the emitter-coupled transistor pair of the differential amplifier arrangement of the complementary current stage convey at least substantially the same working point current, and in that the values of the current supplied by the first constant current source, the current supplied by the second constant current source and the working point current are in the ratio of 3:2:1.

8. A rectifier circuit as claimed in claim 1, characterized by an amplifier stage whose input receives the output voltage of the rectifier circuit, an output of said amplifier stage controlling the complementary current stage.

9. A rectifier circuit as claimed in claim 8, characterized in that the complementary current stage comprises a differential amplifier arrangement having an input which is coupled to the output of the amplifier stage, said differential amplifier arrangement having an output supplying the complementary current.

10. A rectifier circuit as claimed in claim 8, characterized in that the amplifier stage has an AC voltage gain of at least substantially a value of 2 between the output voltage of the rectifier circuit and the complementary current stage.

* * * * *